(12) United States Patent
Mauder et al.

(10) Patent No.: US 8,466,492 B1
(45) Date of Patent: Jun. 18, 2013

(54) SEMICONDUCTOR DEVICE WITH EDGE TERMINATION STRUCTURE

(75) Inventors: Anton Mauder, Kolbermoor (DE); Hans-Joachim Schulze, Taufkirchen (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/362,005

(22) Filed: Jan. 31, 2012

(51) Int. Cl.
*H01L 29/02* (2006.01)

(52) U.S. Cl.
USPC .... 257/171; 257/401; 257/489; 257/E29.009; 257/E29.015

(58) Field of Classification Search
USPC ........... 257/171, 401, 489, E29.009, E29.015
See application file for complete search history.

(56) References Cited

U.S. PATENT DOCUMENTS 4,746,967 A * 5/1988 Emoto et al. ................ 257/489
7,829,972 B2 11/2010 Hirler et al.

OTHER PUBLICATIONS

Hirler et al.. "Semiconductor Device and Method for Forming a Semiconductor." U.S. Appl. No. 13/205,759, filed Aug. 9, 2011.
Ludikhuize, Adriaan W. "A Review of RESURF Technology." Philips Research, Eindhoven. pp. 1-8.
Herzer, Reinhard. "Modellierung, Entwurf, technologische Realisierung und Optimierung von MOS-gesteuerten Hochspannungsbauelementen for Smart Power-Schaltkreise." Habilitation, 1992. pp. 45-46.

* cited by examiner

*Primary Examiner* — Tu-Tu Ho
(74) *Attorney, Agent, or Firm* — Murphy, Bilak & Homiller, PLLC

(57) ABSTRACT

A semiconductor device includes a semiconductor body including a first surface, an inner region and an edge region, a first doped device region of a first doping type in the inner region and the edge region, a second device region forming a device junction in the inner region with the first device region, and a plurality of at least two dielectric regions extending from the first surface into the semiconductor body. Two dielectric regions that are adjacent in a lateral direction of the semiconductor body are separated by a semiconductor mesa region. The semiconductor device further includes a resistive layer connected to the second device region and connected to at least one semiconductor mesa region.

24 Claims, 7 Drawing Sheets

SEMICONDUCTOR DEVICE WITH EDGE TERMINATION STRUCTURE

TECHNICAL FIELD

Embodiments of the present invention relate to a semiconductor device, in particular a vertical power semiconductor device with an edge termination.

BACKGROUND

Power semiconductor devices, such as power diodes, power MOSFETs (metal oxide semiconductor field effect transistors), power IGBTs (insulated gate bipolar transistors) or power thyristors, are designed to withstand high blocking voltages. Those power devices include a pn-junction that is formed between a p-doped semiconductor region and an n-doped semiconductor region. The component blocks (is switched off) when the pn-junction is reverse biased. In this case a depletion regions or space charge zone propagates in the p-doped and n-doped regions. Usually one of these semiconductor regions is more lightly doped than the other one of these semiconductor regions, so that the depletion region mainly extends in the more lightly doped region, which mainly supports the voltage applied across the pn-junction. The semiconductor region supporting the blocking voltage is referred to as base region in a diode or thyristor, and is referred to as drift region in a MOSFET or an IGBT.

The ability of a pn-junction to support high voltages is limited by the avalanche breakdown phenomenon. As a voltage applied across a pn-junction increases, an electric field in the semiconductor regions forming the pn-junction increases. The electric field results in an acceleration of mobile charge carriers present in the semiconductor region. An avalanche breakdown occurs when, due to the electric field, the charge carriers are accelerated such that they create electron-hole pairs by impact ionization. Charge carriers created by impact ionization create new charge carriers, so that there is a multiplication effect. At the onset of an avalanche breakdown a significant current flows across the pn-junction in the reverse direction. The voltage at which the avalanche breakdown sets in is referred to as breakdown voltage.

The electric field at which the avalanche breakdown sets in is referred to as critical electric field ($E_{crit}$). The absolute value of the critical electric field is mainly dependent on the type of semiconductor material used for forming the pn-junction, and is weakly dependent on the doping concentration of the more lightly doped semiconductor region.

The critical electric field is a theoretical value that is defined for a semiconductor region that has an infinite size in directions perpendicular to field strength vectors of the electric field. Power semiconductor components, however, have semiconductor bodies of finite size that are terminated by edge surfaces in lateral directions. In vertical power semiconductor devices, which are semiconductor devices in which the pn-junction mainly extends in a horizontal plane of the semiconductor body, the pn-junction usually does not extend to the edge surface of the semiconductor body but is distant to the edge surface of the semiconductor body in a lateral direction. In this case, a semiconductor region (edge region) of the semiconductor body adjoining the pn junction in the lateral direction also has to withstand the blocking voltage.

The edge region could be implemented as a doped region with the same doping concentration as the base or drift region. In this case, however, the dimension of the edge region in the lateral direction of the semiconductor body is at least the dimension (length) of the drift region in the vertical direction. The length of the drift region can be up to several 10 micrometers (μm) and more, dependent on the desired voltage blocking capability, so that a corresponding edge termination would be very space consuming.

In order to reduce the space required for withstanding the blocking voltage in the edge region, an edge termination with a vertical dielectric layer arranged in a trench can be provided. In order to support high voltages, a thick dielectric layer is required. A thick dielectric layer in a trench, however, can cause mechanical stress in the semiconductor body.

There is therefore a need for a semiconductor device with an efficient and space saving edge termination.

SUMMARY

One embodiment relates to a semiconductor device including a semiconductor body having a first surface, an inner region and an edge region. The semiconductor device further includes a first doped device region of a first doping type in the inner region and the edge region, a second device region forming a device junction in the inner region with the first device region, and a plurality of dielectric regions extending from the first surface into the semiconductor body, with two dielectric regions that are adjacent in a lateral direction of the semiconductor body being separated by a semiconductor mesa region. Further, a resistive layer is connected to the second device region and to at least one semiconductor mesa region.

Those skilled in the art will recognize additional features and advantages upon reading the following detailed description, and on viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
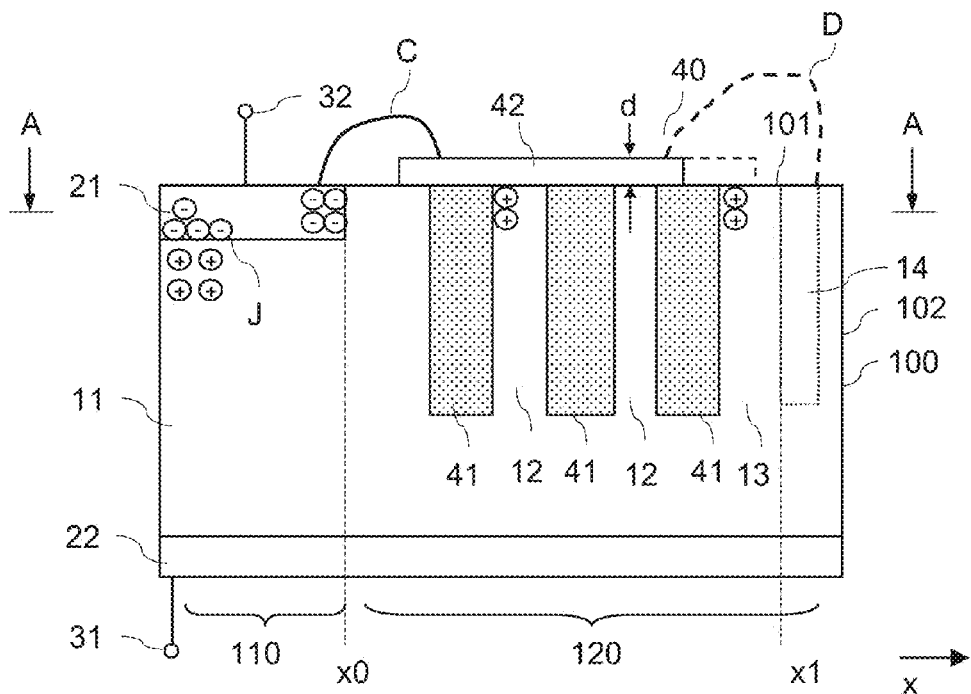
FIG. 1 illustrates a vertical cross sectional view of a semiconductor device having an edge termination structure according to a first embodiment.

FIG. 1 illustrates a vertical cross sectional view of a semiconductor device according to a first embodiment. The semiconductor device includes a semiconductor body 100 having a first surface 101, an inner region 110 and an edge region 120. FIG. 1 illustrates the semiconductor device in a vertical section plane, which is a section plane perpendicular to the first surface 101. The semiconductor body 100 includes a conventional semiconductor material, such as, for example, silicon (Si), silicon carbide (SiC), gallium nitride (GaN) or the like.

Referring to FIG. 1, a first doped device region 11 of a first doping type is arranged in the inner region 110 and the edge region 120. A second device region 21 forms a junction J with the first device region 11 in the inner region 110. The junction J is either a pn junction or a Schottky junction. In the first case, the further device region 21 is a semiconductor region of a second doping type complementary to the first doping type. In the second case, the further device region 21 is a Schottky region or Schottky metal, such as, for example, aluminum (Al), tungsten silicide (WSi), tantalum silicide (TaSi), titanium silicide (TiSi), platinum silicide (PtSi), or cobalt silicide (CoSi).

The first device region 11 is electrically coupled or connected to a first electrode or terminal 31 via a further doped device region 22 that has a higher doping concentration than the first device region 11, and the second device region 21 is electrically coupled to a second electrode or terminal 32. The first device region 11 is also referred to as drift region or base region in the following.

The semiconductor device further includes an edge termination structure 40 with a plurality of dielectric regions 41 in the edge region 120. The semiconductor device may include further device features, such as, for example, a gate electrode when the semiconductor device is implemented as an MOS transistor. However, in FIG. 1, as well as in FIGS. 2 to 12, only those features of the semiconductor device are illustrated that are necessary to understand the operating principle of the edge termination structure 40 when the junction J is reverse biased. The edge termination structure 40 can be employed in any semiconductor device that includes a drift region, such as drift region 11 illustrated in FIG. 1, and a junction, such as junction J between the drift region 11 and the second device region 21 illustrated in FIG. 1. Semiconductor devices having a drift region and a junction between a drift region and a second device region are, for example, MOS transistors, such as MOSFETs (Metal Oxide Gate Field-Effect Transistors) or IGBTs (Insulated Gate Bipolar Transistors), p-i-n diodes, Schottky diodes, JFETs (Junction Field-Effect Transistors).

The inner region 110 in which the device junction J is located can also be referred to as active region of the semiconductor device. The edge region 120 adjoins the inner region or active region 110 in lateral directions of the semiconductor body 100 and surrounds the inner region 110. "Lateral directions" of the semiconductor body 100 are directions parallel to the first surface 101 of the semiconductor body 100. Since the edge region 120 surrounds the active region 110, the edge region 120 is always located between the active region 110 and an edge surface 102 of the semiconductor body 100. The "edge surface" 102 is a surface of the semiconductor body 100 that terminates the semiconductor body 100 in the lateral directions. Referring to FIG. 1, the edge region 120 may adjoin the edge surface 102. However, the edge region 120 need not necessarily adjoin the edge surface 102. According to a further embodiment (not illustrated) the edge region 120 could also be located between the inner region 110 and active regions of further semiconductor devices (not illustrated) implemented in the semiconductor body 100. Thus, the edge region 120 and the edge termination structure 40 implemented in the edge region 120 "terminate" the semiconductor device with the active region 110 but not necessarily terminate the semiconductor body 100 in which additional semiconductor devices can be implemented. In other words, in one semiconductor body 100 two or more semiconductor devices may be integrated monolithically where each of these semiconductor devices has its own termination system. These termination systems of the single semiconductor devices may differ from each other depending on the demands, especially the desired voltage blocking capability, of each integrated semiconductor device.

Referring to FIG. 1, the edge termination structure 40 includes a plurality of dielectric regions 41 each extending from the first surface 101 into the semiconductor body 100. In FIG. 1, three dielectric regions 41 are illustrated. However, this is only an example. The overall number of dielectric regions 41 can be selected arbitrarily dependent on a desired voltage blocking capability of the semiconductor device. In general, the number of dielectric regions 41 that is required increases when the desired voltage blocking capability increases.

Referring to FIG. 1, the individual dielectric regions 41 are spaced in lateral directions facing away from the inner region 110, and semiconductor mesa regions 12 are arranged between two adjacent dielectric regions 41. The semiconductor mesa regions 12 may have the same doping type as the drift region 11. However, the doping concentration of the semiconductor mesa regions 12 can be different from the doping concentration of the drift region 11. The doping concentration of the drift region 11 is, for example, between 1e12 $cm^{-3}$ and 1e16 $cm^{-3}$. The dielectric regions 41 include, for example, an oxide, a nitride, a gas, a vacuum or the like. According to one embodiment, the dielectric regions 41 are homogenous regions including only one dielectric material. According to another embodiment, the dielectric regions 41 are composite regions including several layers with different dielectric materials. These layers can be stacked in the vertical direction and/or in the lateral direction of the semiconductor body 100.

Referring to FIG. 1, the edge termination structure 40 further includes a resistive layer 42 connected to the second device region 21 and connected to at least one semiconductor mesa region 12. In the embodiment illustrated in FIG. 1, the resistive layer 42 is connected to each of the semiconductor mesa regions 12, with each mesa region 12 located between two adjacent dielectric regions 41. The electrical connection C between the resistive layer 42 and the first device region 21 is only schematically illustrated in FIG. 1.

The edge termination structure 40 further includes an outer doped region 13 of the same doping type as the drift region 11. The outer region 13 is adjacent the outermost dielectric region 41 in a lateral direction facing away from the inner region 110. The "outermost dielectric region" 41 is the dielectric region that is located most distant to the inner region 110 in the lateral direction of the semiconductor body 100. According to one embodiment (illustrated in dashed lines in FIG. 1) the resistive layer 42 is also connected to the outer doped region 13.

Further, a second electrical connection D may optionally be placed between the resistive layer 42 and the semiconductor surface adjoining the edge surface 102 of the semiconductor body 100 and/or may be optionally placed between the resistive layer 42 and the first electrode or terminal 31. The electrical connection D is only schematically illustrated (in dashed lines) in FIG. 1, in this case between the resistive layer 42 and the semiconductor surface adjoining the edge surface 102.

In the embodiment illustrated in FIG. 1, the device junction J is distant to the innermost dielectric region 41. The "innermost dielectric region" 41 is the dielectric region that is closest to the inner region 110. According to a further embodiment (illustrated in dashed lines in FIG. 1), the device junction J extends to the innermost dielectric region 41 in the lateral direction of the semiconductor body 100.

Figure 2:
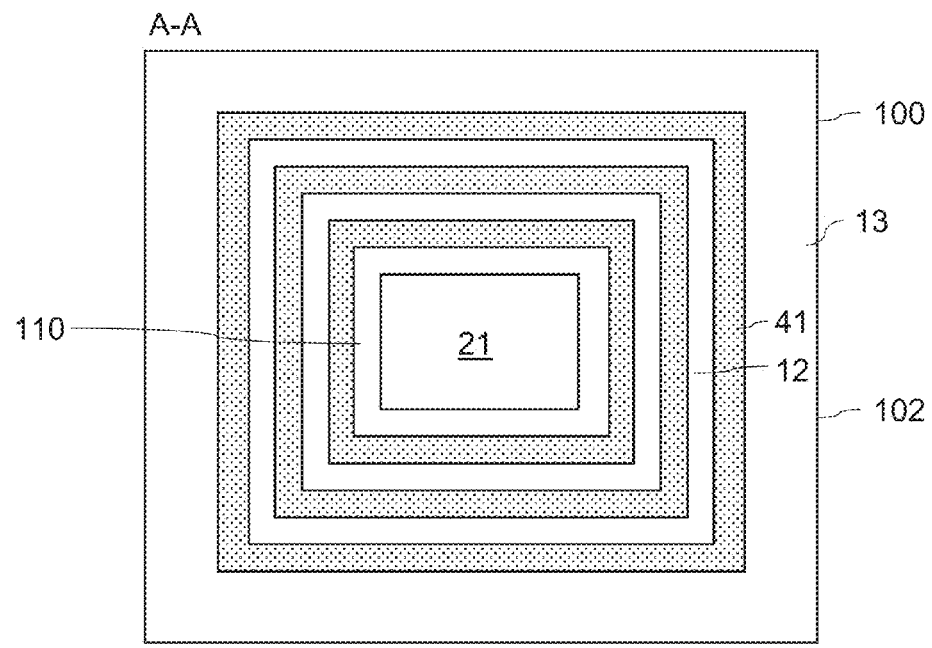
FIG. 2 illustrates a horizontal cross sectional view of the semiconductor device including an edge termination with concentric dielectric regions.

FIG. 2 illustrates a horizontal cross sectional view of the semiconductor device with the edge terminal structure 40. FIG. 2 shows the semiconductor device in a horizontal section plane A-A that extends through the semiconductor body 100 below the first surface 101 and in the region of the first device region 21 and the dielectric regions 41. Referring to FIG. 2, the dielectric regions 41 can be implemented as concentric rings around the inner region 110 and the first device region 21, respectively. In the semiconductor device of FIG. 2, these concentric rings are rectangular rings. However, this is only an example. These rings could also be implemented with any other type of ring form, such as an elliptical form or circular form. In the embodiment of FIG. 2, the semiconductor body 100 is also rectangular in the horizontal plane, and sections of the individual ring-shaped dielectric regions 41 extend parallel to edge surfaces 102 of the semiconductor body 100. However, having sections of the dielectric regions 41 extending parallel with the edge surfaces 102 of the semiconductor body 100 is only an example. Other embodiments will be explained with reference to FIGS. 11 and 12 below.

Figure 3:
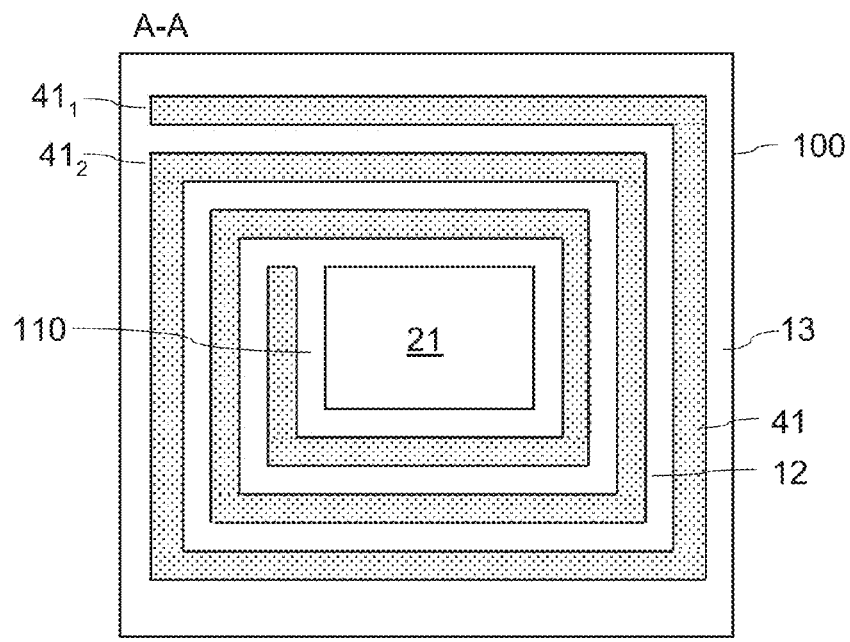
FIG. 3 illustrates a horizontal cross sectional view of a semiconductor device including an edge termination with a plurality of dielectric regions forming a spiral.

FIG. 3 illustrates a horizontal cross sectional view of a semiconductor device with an edge termination structure according to a further embodiment. In this embodiment, the individual dielectric regions 41 each have the form of an open ring with a first end $41_1$ and a second end $41_2$. The first and second ends $41_1$, $41_2$ of one of the dielectric regions 41 are indicated in FIG. 3. Two adjacent dielectric regions 41 adjoin one another at one of these ends, so that the individual dielectric regions 41 form a spiral surrounding the inner region 110. Although the individual dielectric regions 41 have the form of rectangular open rings in FIG. 3, other forms of open rings, such as elliptic rings or circular rings can be implemented as well.

The operating principle of the semiconductor device with the edge termination structure 40 is explained in the following. Just for explanation purposes it is assumed that the device junction J is a pn junction between an n-doped first device region 11 and a p-doped second device region 21. The maximum doping concentration of the second device region is, for example, between 1e17 $cm^{-3}$ and 1e21 $cm^{-3}$. It is further assumed that the doping concentration of the first device region 11 is much lower (at least ten times lower) than the maximum doping concentration of the second device region 21.

For explanation purposes it is further assumed that the semiconductor device is blocking, which means that the semiconductor device is operated such that the pn junction J is reverse biased. The pn junction can be reverse biased by applying a positive voltage between the first terminal 31 and the second terminal 32. When a positive voltage is applied between the first terminal 31 and the second terminal 32, there is a voltage difference between the third device region 22 and the second device region 21. This voltage difference causes a depletion region (space charge region) to expand in the first device region 11 and in the second device region 21 beginning at the pn junction J. As the voltage increases, the depletion region expands deeper into the semiconductor body 100 in the direction of the third device region 22. The third device region 22 is a relatively high doped region having a doping concentration of, for example, more than 1e19 $cm^{-3}$. The outer region 13 is electrically coupled to the third device region 22 so that there is not only a voltage difference in the vertical direction of the semiconductor body 100 between the third device region 22 and the second device region 21, but there is also a voltage difference in a lateral direction of the semiconductor body 100 between the outer region 13 and the second device region 21. Thus, a depletion region also expands in the edge region 120, and, in particular, in the mesa regions 12. Since the doping concentration of the drift region 11 is usually much lower than the doping concentration of the body region 21, the depletion region mainly expands in the drift region 11, but also extends into the body region 100.

When a depletion region expands or propagates in the first device region 11 dopant atoms are ionized in the first device region 11 and in the second device region 21 so that each ionized dopant atom in the first device region 11 has a corresponding ionized dopant atom in the second device region 21. Some ionized dopant atoms in the first device region 11 and the second device region 21 are schematically illustrated in FIG. 1. The ionization of dopant atoms in the n-type first device region 11 results in positive charges in the first device region 11, and the ionization of p-type dopant atoms in the second device region 21 results in negative dopant charges in the second device region 21. Equivalently, the expansion or propagation of a depletion region in the edge region 120 is associated with the ionization of dopant atoms in the edge region 120 and the ionization of corresponding doping atoms in the second device region 21. Some of these ionized dopant atoms in the edge region 120 and the second device region 21 are also schematically illustrated in FIG. 1.

In the edge region 120, the "counter charges" corresponding to ionized dopant atoms in the second device region 21 can be ionized dopant atoms in the mesa regions 12 and the outer region 13 and can be charges at or close to the interfaces between the dielectric regions 41 and the surrounding semiconductor regions, such as the mesa regions 12 and the outer region 13. According to one embodiment, the semiconductor mesa regions 12 have a higher doping concentration than the drift region 11. In this case, the semiconductor mesa regions 12 significantly contribute to the provision of ionized dopant atoms in the edge region 120. According to a further embodiment, the semiconductor mesa regions 12 have the same doping concentration as the drift region 11 or have an even lower doping concentration than the drift region 11. In this embodiment, the outer region 13 may have a doping concentration higher than the doping concentration of the drift region 11. In this embodiment the outer region 13 significantly or mainly contributes to the provision of ionized dopant atoms in the edge region 120.

According to another embodiment, the doping concentration in outer region 13 is only locally increased as compared to the doping concentration of the drift region 11, namely a region surrounding the outermost dielectric region 41 and/or one or more dielectric regions 41 adjoining the outermost dielectric region 41 in a lateral direction towards the second device region 21. Typically, the doping concentration of the mesa regions 12 may be in a range of between approximately 1% and 200% of the doping concentration of the drift region 11. The maximum doping concentration of the outer region 13 or a higher, maximum doping surrounding the outermost dielectric region 41 may even exceed the doping of the drift region 11 by more than a factor of 10.

Figure 4:
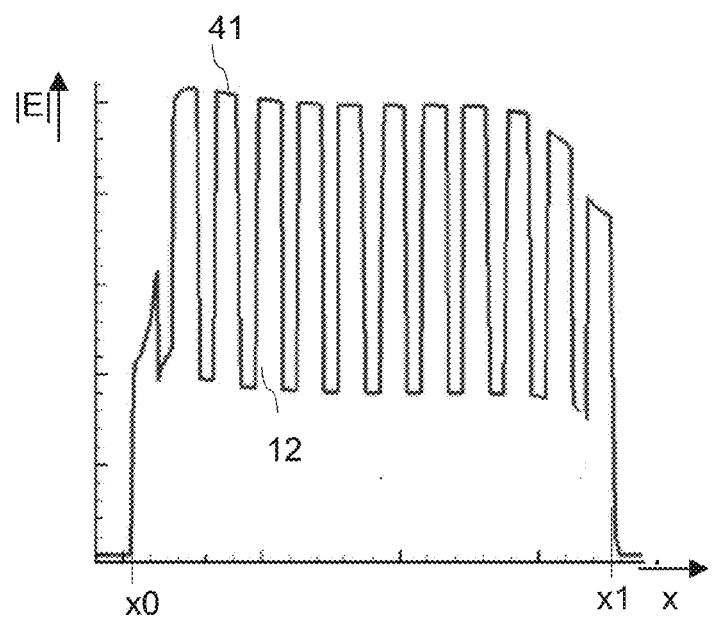
FIG. 4 schematically illustrates the electric field in the edge terminal structure when the semiconductor device is blocking.

FIG. 4 illustrates the absolute value |E| of the electric field E in the edge region 120 along a line extending in a lateral direction x of the semiconductor device according to FIG. 1. In FIGS. 1 and 4, x0 is the position close to the pn junction in the lateral direction of the semiconductor body 100. Position x0 is located in the second device region 21. Position x1 is the position at which the absolute value of the electric field strength decreases to zero. In the embodiment shown in FIG. 4, the doping concentration of the outer region 13 may be at least locally increased as compared to the doping concentrations in the mesa regions 12. This results in a steep reduction of the electric field E. Thus, the position x1 is located in the outer region 13 in the case shown in FIG. 4. However, it may also be possible that the position x1 may be located in one of the mesa regions 12 (not shown in FIG. 4). Referring to FIG. 4, the absolute value of the electric field strength has local maxima and local minima. The local maxima are in the dielectric regions 41 that have a higher dielectric strength than the semiconductor material of the semiconductor body 100. The minima are in the semiconductor mesa regions 12. In the embodiment illustrated in FIG. 4, the absolute value of the electric field strength in the semiconductor mesa regions 12 does not significantly decrease when proceeding from semiconductor mesa region 12 to semiconductor mesa region 12 in the direction x. This is an indication that in the semiconductor device having a behavior as illustrated in FIG. 4 the doping concentration of the mesa regions 12 is relatively low, so that the mesa regions 12 do not significantly contribute to the provision of ionized dopant atoms in the edge region 120. In this semiconductor device, the majority of ionized dopant atoms (that are required to generate the electric field) are provided in the outer region 13. According to one embodiment, the outer region 13 includes a higher doped semiconductor region acting as a field stop region. This higher doped region 14 is illustrated in dotted lines in FIG. 1. The maximum doping concentration of this region is, for example, a factor of 10 or higher than the doping concentration of the drift zone 11, or about 1e17 cm$^{-3}$ or more.

The lateral field stop 14 can be omitted when enough charges are provided in the mesa regions 12 and at the interfaces between the mesa regions 12 and the dielectric regions 41. According to one embodiment, the semiconductor material of the semiconductor body 100 is silicon and the dielectric regions 41 include silicon oxide. It is commonly known that at an interface between silicon and silicon oxide there can be different types of an electric charges, such as interface trapped charges, oxide trapped charges or fixed oxide charges. The presence or the generation of those charges can be influenced by the specific process used to generate the dielectric regions 41. These dielectric regions 41 are, for example, generated by forming trenches in the first surface 101 and thermally oxidizing sidewalls of the trenches until the trenches are completely filled. Alternatively, the surface of the trenches may be oxidized thermally and the remaining void may be filled with another dielectric. This other dielectric may include an oxide, a nitride, a gas, a vacuum or a combination of one or more of the materials mentioned. For example, in order to generate negative charges at the interface between the dielectric regions 41 and the mesa regions 12 the oxide can be doped with aluminum (Al) during the oxidation process. In order to generate positive charges, the oxide can be doped with cesium (Cs).

The voltage between the lateral positions x1 and x0 of the semiconductor device corresponds to the integral of the absolute value of the electric field strength. By virtue of the dielectric regions 41 having a higher dielectric strength than the semiconductor material, the voltage that can be supported between x1 and x0 is much higher than the voltage that could be supported if the dielectric regions 41 were omitted. In other words, the dielectric mesa regions 41 help to reduce a width of the edge termination structure 40 as compared with an edge termination structure without dielectric regions 41 and having the same voltage blocking capability. The number of dielectric regions 41 that are required depends on the desired voltage blocking capability. The simulation illustrated in FIG. 4 is based on a semiconductor device having eleven dielectric regions 41. However, dependent on the desired voltage blocking capability more than eleven or less than eleven dielectric regions 41 could be provided.

For example, an edge termination structure 40 that is capable of supporting a voltage of 600V in the lateral direction may only have a width of about 15 μm, while conventional edge termination structures without dielectric regions have a width of 100 μm or more. The "width" of the edge termination structure is the dimension of the edge termination structure 40 in the lateral direction x. This width is mainly defined by the dielectric regions 41 and the mesa regions 12.

A voltage blocking capability $U_{ET-MAX}$ of the edge termination (ET) 40 can be approximated as follows:

$$U_{ET-MAX} = \left(\frac{\varepsilon_S}{\varepsilon_D} \cdot \frac{w_D}{w_S} + 1\right) \cdot U_{11-MAX} \quad (1)$$

where $\varepsilon_S$ is the dielectric constant of the semiconductor material of the mesa regions 12, $\varepsilon_D$ is the dielectric constant of the material of the dielectric regions 41, $w_S$ is the overall width of the semiconductor mesa regions 12 in the lateral direction x, and $w_D$ is the overall width of the dielectric regions 41 in the lateral direction x. $U_{11-MAX}$ is the voltage blocking capability of a termination system consisting only of the semiconductor material without vertical dielectric regions 41 and having the same width in the lateral direction as a termination system consisting of mesa regions 12 and dielectric regions 41. The overall width $w_D$ is the sum of the individual widths of the dielectric layers 41 in the lateral direction, and the overall width $w_S$ is the sum of the individual widths of the mesa regions 12 in the lateral direction.

The width w of the edge termination structure 40 is approximately given by:

$$w = w_D + w_S \qquad (2)$$

Referring to equations (1) and (2) it is desirable to maximize the overall width of the dielectric regions 41 and to minimize the overall width of the mesa regions 12, in order to minimize the width w of the edge termination structure 40 at a given voltage blocking capability $U_{ET-MAX}$. In the example given in FIG. 4, the mesa regions 12 have a width of approximately 0.6 μm each and the dielectric regions 41 of approximately 0.9 μm each, but this is only an example. The width of a mesa region 12 may be in a range of 0.01 μm or 0.1 μm to 10 μm and the width of a dielectric region 41 may be in a range of 0.05 to 5 μm or even up to 20 μm. As compared to providing a single wide trench filled with a dielectric material, providing a plurality of trenches with dielectric regions 41 and semiconductor mesa regions 12 between the individual trenches reduces the mechanical stress in the semiconductor body 100.

In the edge termination structure 40 of FIG. 1, the (lateral) electric field strength in the semiconductor mesa regions 12 can even be higher than the critical electrical field strength of the (homogeneous) semiconductor material of the mesa regions 12. The critical electric field strength is the field strength at which usually an avalanche multiplication of charge carriers sets in. In the semiconductor mesa regions 12, however, charge carriers at high electric field strength are accelerated in the direction of the dielectric regions 41. When the lateral voltage drop over a single semiconductor region 12 is lower than the bandgap voltage of the semiconductor material (about 1.1V in silicon), no avalanche multiplication should occur. In this case, the maximum electric field in the dielectric material at which reliable operation is still possible, defines the blocking capability and the width of the termination system. The width of the individual mesa regions 12 therefore should be low, such as less than 0.5 μm or less than 0.1 μm to reduce the consumption of space for the termination system, When the semiconductor device is blocking, charge carriers can be thermally generated in the semiconductor mesa regions 12. These thermally generated charge carriers include majority charge carriers, which are electrons when the mesa regions 12 are n-type mesa regions, and minority charge carriers, which are p-type charge carriers when the mesa regions 12 are n-type mesa regions. While the majority charge carriers flow to the third device region 22, the minority charge carriers accumulate in the semiconductor mesa regions 12 if no additional measures are taken. Such an accumulation of minority charge carriers in the edge region 120 would reduce the voltage blocking capability of the semiconductor device in the edge region 120.

In the edge termination structure 40 of FIG. 1, the resistive layer 42 that is connected to the mesa regions 12 prevents the accumulation of minority charge carriers in the mesa regions 12 and conducts the minority charge carriers to the second device region 21. The resistive layer 42 is implemented such that it is capable to withstand high electric field strengths corresponding to the electric field strengths in the dielectric regions 41. According to one embodiment, the resistive layer 42 includes a semi-insulating material, such as doped glass, polycrystalline or amorphous DLC (diamond like carbon), amorphous hydrogen doped carbon (aC:H) or an amorphous or polycrystalline wide band gap semiconductor material, such as silicon carbide (SiC), gallium arsenide (GaAs), gallium nitride (GaN) or aluminum-gallium nitride (AlGaN). The specific electric resistance of the resistive layer 42 is, for example, between 1e3 $\Omega mm^2/m$ and 1e7 $\Omega mm^2/m$. The specific electric resistance of doped glass, DLC or of white band gap materials can be adjusted by suitably selecting a doping concentration of these materials. A layer thickness d of the resistive layer 42 is, for example, in the range of between 100 nm and several micrometers (μm).

Figure 5:
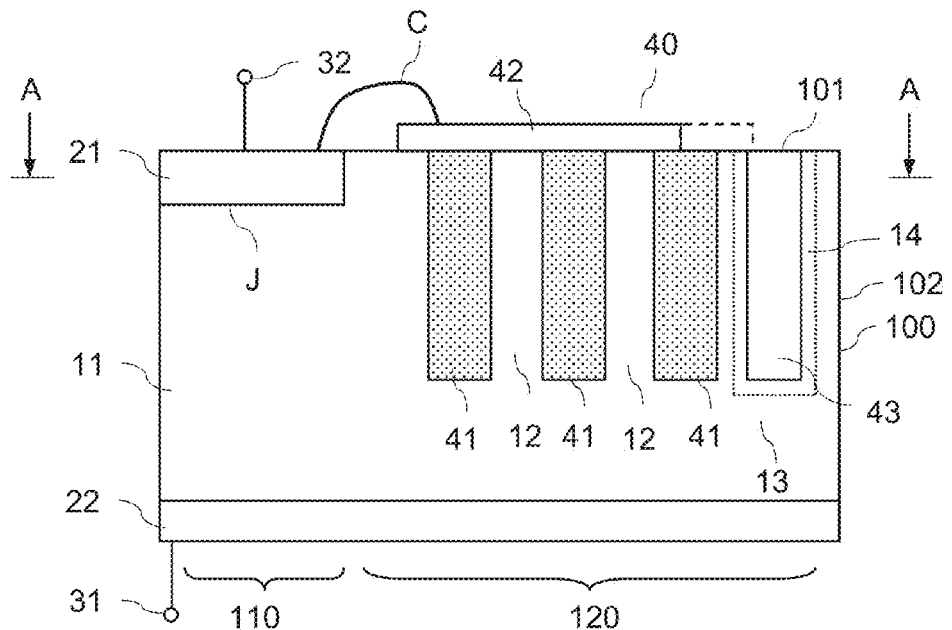
FIG. 5 illustrates a vertical cross sectional view of a semiconductor device with an edge termination according to a second embodiment.

FIG. 5 illustrates a vertical cross sectional view of a semiconductor device with an edge termination structure 40 according to a further embodiment. In this embodiment, the semiconductor device includes a trench with a dopant source 43 in the outer region 13. This trench surrounds the dielectric regions 41 and the mesa regions 12 in the horizontal plane A-A. The dopant source 43 in the trench provides dopant atoms of the first doping type, which is the doping type of the drift region 11 and also the doping type of the outer region 13. During the manufacturing process of the semiconductor device dopant atoms from the dopant source 43 diffuse into the outer region 13 so as to generate a higher doped region around the trench. This higher doped region 14 may act as a field stop region already explained with reference to FIG. 1. The dopant source 43 is, for example, a doped polycrystalline semiconductor material, such a polysilicon, or a doped insulating material, such as PSG (phosphorous silicate glass) or BPSG (boron-phosphorous silicate glass). When the edge region 120 adjoins the edge surface 102 of the semiconductor body, this trench may additionally serve to prevent that foreign atoms diffuse from the edge surface 102 into the edge termination structure 40. Further, this trench may help to prevent the propagation of crystal defects from the edge surface 102 into the semiconductor body 100. In case a higher doping is not necessary, the trench may be filled with undoped or only low doped polysilicon or a glass. "Undoped" in connection with polysilicon means that there is no intended doping concentration, however, due to the manufacturing process the presence of a very low concentration of dopant atoms in polysilicon is hardly to avoid. Alternatively, the trench is filled with a highly doped material after a last high temperature process step has been performed in the manufacturing process, so as to avoid diffusion of dopant atoms out of the filling material into the semiconductor material.

In the embodiments of FIGS. 1 and 5 the dielectric regions 41 do not extend down to the third device region 22 in the vertical direction of the semiconductor body 100. However, a length of the dielectric regions 41, which is the dimension of the dielectric regions 41 in the vertical direction of the semiconductor body 100 is at least so high that the electric field in the semiconductor material below the dielectric regions 41 is lower than the critical electric field of the semiconductor material from which an avalanche multiplication may occur. In the example the length of the dielectric regions 41 exceeds 50% to 80% of a length of the drift region 11. The length of the drift region 11 is the dimension of the drift region 11 between the second device region 21 and the third device region 22.

Figure 6:
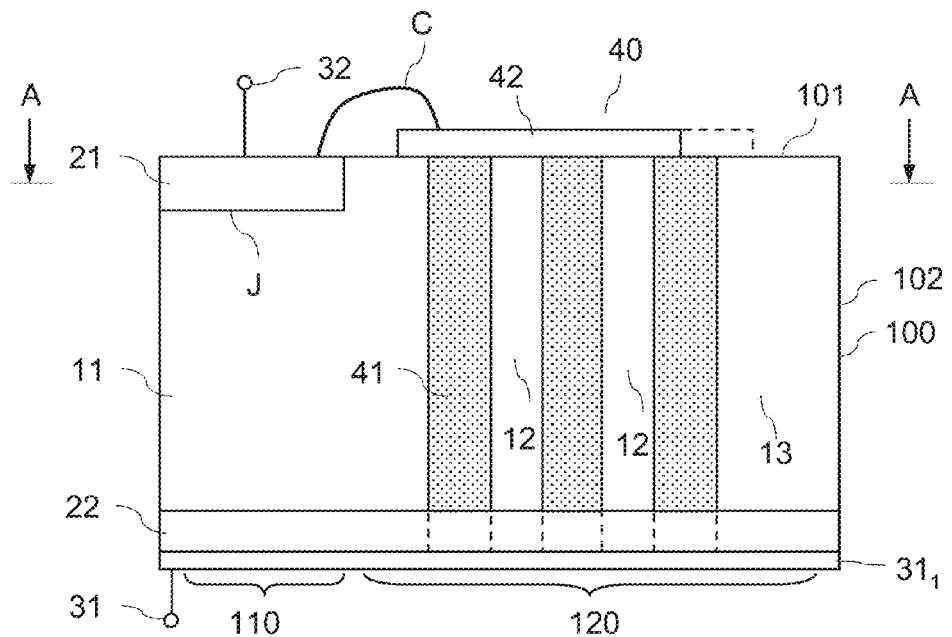
FIG. 6 illustrates a vertical cross sectional view of a semiconductor device with an edge termination according to a third embodiment.

According to a further embodiment, illustrated in FIG. 6, the dielectric regions 41 extend down to the third device region 22 in the vertical direction of the semiconductor body 100. Referring to FIG. 6, the first terminal 31 may include an electrode layer $31_1$ on the third device region 22. The dielectric regions 41 may even extend through the third device region 22 to the electrode layer $31_1$ (as illustrated in dashed lines in FIG. 6). Of course, the electrode layer 31₁ can also be provided in the other semiconductor devices explained herein.

In the embodiments illustrated in FIGS. 1, 5 and 6 the individual dielectric regions 41 have the same vertical length. However, this is only an example. The dielectric regions 41 could also be implemented with mutually different vertical lengths.

In the embodiments illustrated in FIGS. 1, 5 and 6, the resistive layer 42 adjoins the mesa regions 12 on the first surface 101, so that the resistive layer 42 is directly connected to the mesa regions 12.

Figure 7:
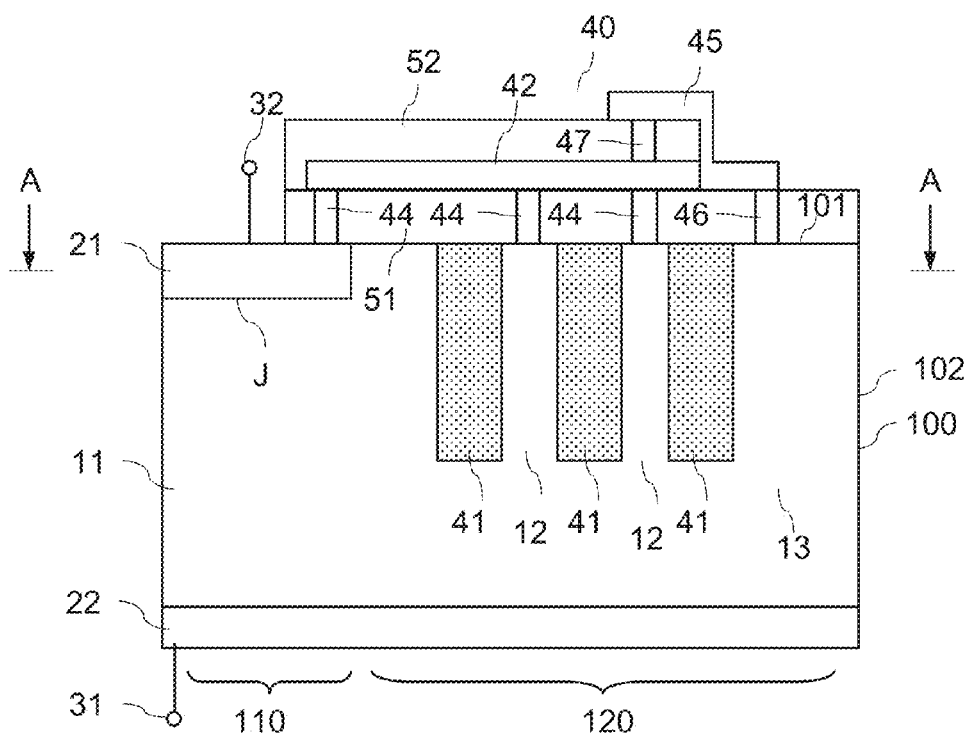
FIG. 7 illustrates a vertical cross sectional view of a semiconductor device with an edge termination according to a fourth embodiment.

According to a further embodiment illustrated in FIG. 7, a dielectric layer or insulating layer 51 is arranged between the first surface 101 and the resistive layer 42. In this embodiment, the resistive layer 42 is connected to the mesa regions 12 and to the second device region 21 through electrically conducting vias 44 extending from the resistive layer 42 through the insulating layer 51 to the mesa regions 12 and to the second device region 21, respectively.

A passivation layer 52 covers the resistive layer 42. The passivation layer 52 is, for example, a nitride layer, such as a silicon-nitride ($Si_3N_4$) layer. The passivation layer 52 prevents moisture or ions from penetrating into the resistive layer 42 and the underlying semiconductor body 100. Such a passivation layer 52 can also be provided in each of the embodiments explained before (but is not illustrated in these embodiments). In the embodiment of FIG. 7, the resistive layer 42 is also connected to the outer region 13. In this embodiment, the outer region 13 is connected to a conductor 45 through a first via 46 extending through the insulation layer 51, and the conductor 45 is connected to the resistive layer 42 through a second via 47 extending through the passivation layer 52.

Figure 8:
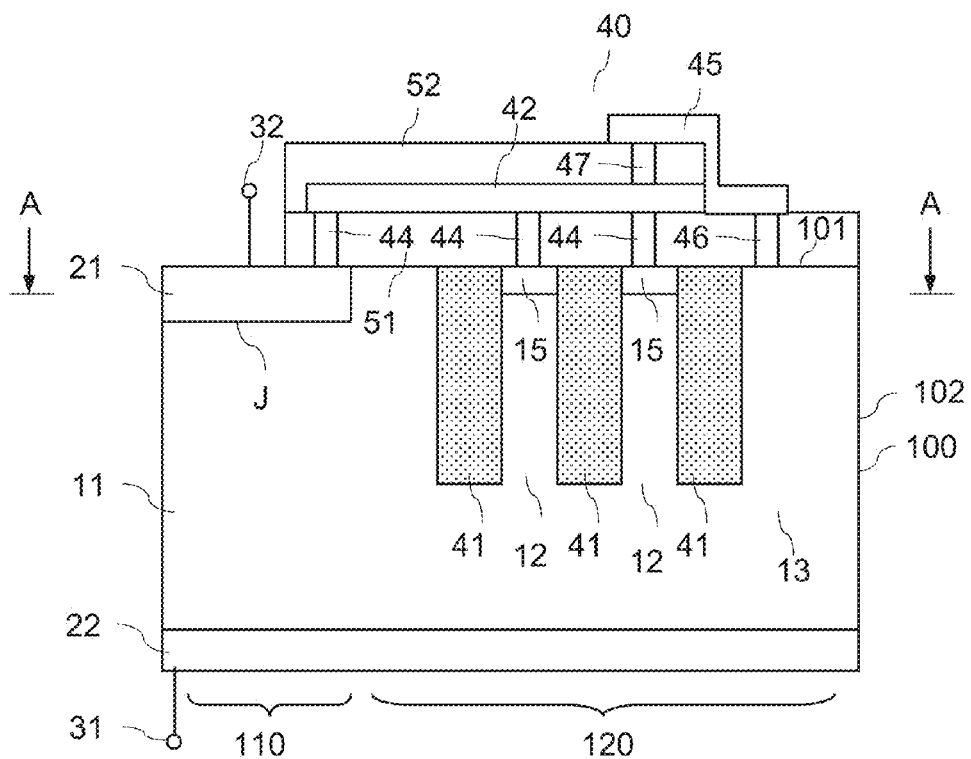
FIG. 8 illustrates a vertical cross sectional view of a semiconductor device with an edge termination according to a fifth embodiment.

Referring to FIG. 8 which illustrates a vertical cross sectional view of the semiconductor device according to a further embodiment, the mesa regions 12 are connected to the resistive layer 42 via contact regions 15. These contact regions 15 are either semiconductor regions of a doping type complementary to the doping type of the mesa regions 12, or are Schottky regions. When the contact regions 15 are doped semiconductor regions, the maximum doping concentration is, for example, between $1E15/cm^3$ and $1E20/cm^3$. The contact regions 15 or Schottky regions may provide at least a part of the mirror charge (counter charge) for the ionized doping atoms in the mesa regions 12 during switching. Additionally, the contact regions 15 may provide an electrical conductive connection between the mesa regions 12 and the resistive layer 42 to drain e.g. thermally generated carriers in the mesa regions 12 during blocking operation of the device.

The resistive layer 42 can be a continuous resistive layer covering the edge region 120 with the dielectric regions 41 and the mesa regions 12.

Figure 9:
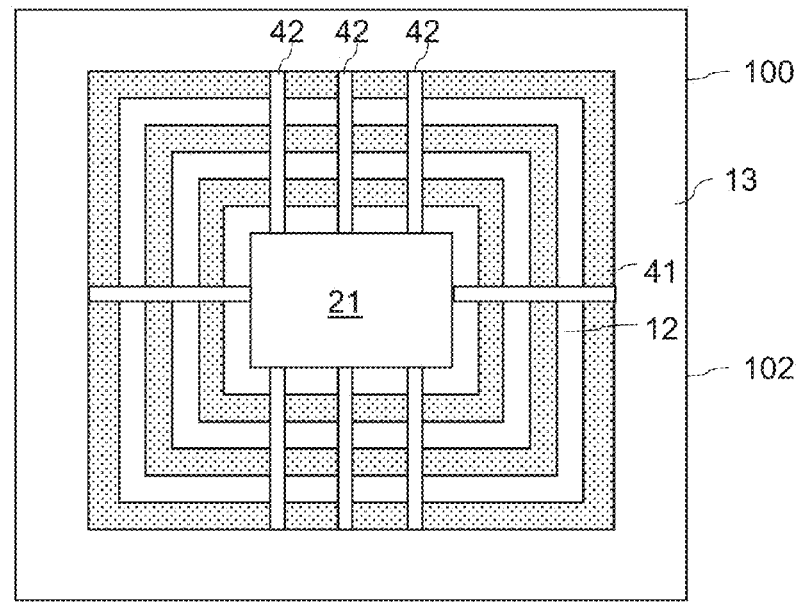
FIG. 9 illustrates a horizontal cross sectional view of a semiconductor device having an edge termination with several resistive layers according to a first embodiment.

According to a further embodiment illustrated in FIG. 9, the resistive layer 42 includes several layer segments, with each of these layer segments being connected to the second device region 21 and to the mesa regions 12. These layer segments are only schematically illustrated in FIG. 9. These layer segments can be implemented as illustrated in FIGS. 1, 5 and 6 where the resistive layer 42 directly contacts the mesa regions 12, or the layer segments can be implemented as illustrated in FIGS. 7 and 8, where the resistive layer 42 is arranged above an insulating layer 51 and is connected to the mesa regions 12 and the second device region 21 through vias.

Figure 10:
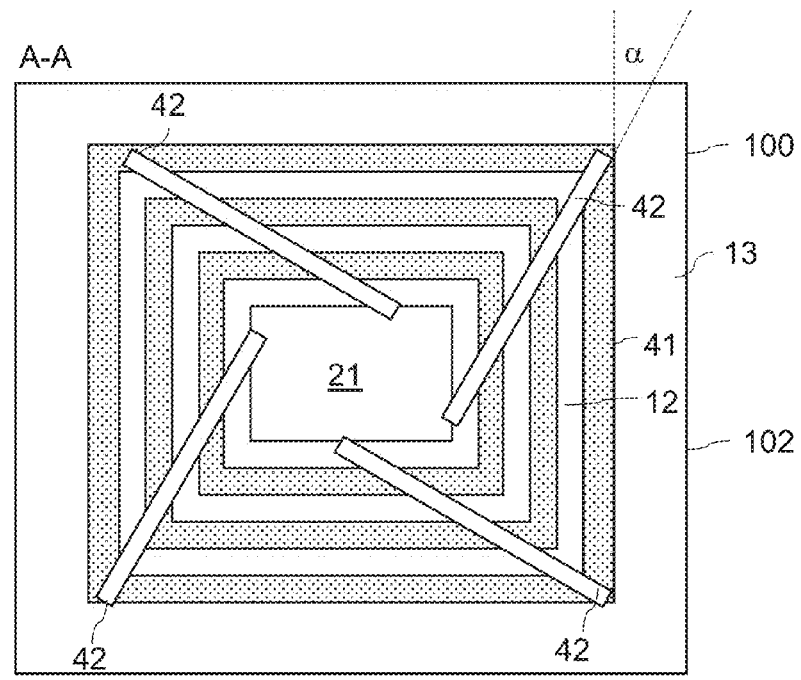
FIG. 10 illustrates a horizontal cross sectional view of a semiconductor device having an edge termination with several resistive layers according to a second embodiment.

In the embodiment according to FIG. 9, the layer segments are elongated segments that basically extend to the mesa regions 12 they are contacting. Referring to FIG. 10, which illustrates a horizontal cross sectional view of a semiconductor device according to a further embodiment, the elongated layer segments 42 could also be implemented to include an angle α other than 90° with the dielectric regions 41 and the mesa regions 12. Angle α is, for example, between 10° and 80°, between 15° and 60°, or between 30° and 60°. In this embodiment, the elongated resistive layer segments 42 are longer than in the embodiment according to FIG. 9. Thus, in the embodiment of FIG. 10, besides the materials explained before, a material can be used to implement the resistive layer segments 42 that has a lower dielectric strength than the materials explained before. According to one embodiment, the layer segments 42 of FIG. 10 are implemented with a deposited polycrystalline semiconductor material, such as semi-insulating polycrystalline silicon (SIPOS).

Figure 11:
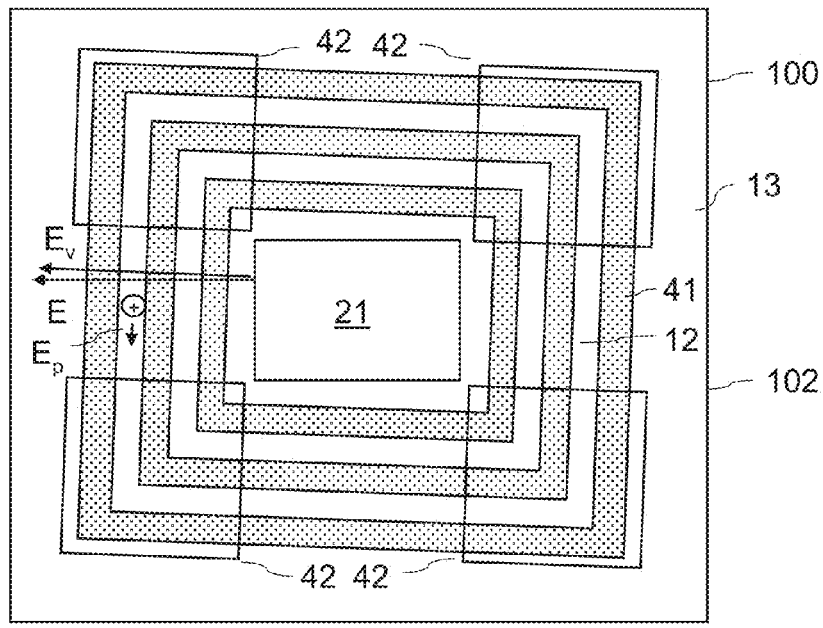
FIG. 11 illustrates a horizontal cross sectional view of a semiconductor device having an edge termination with several resistive layers according to a third embodiment.
Figure 12:
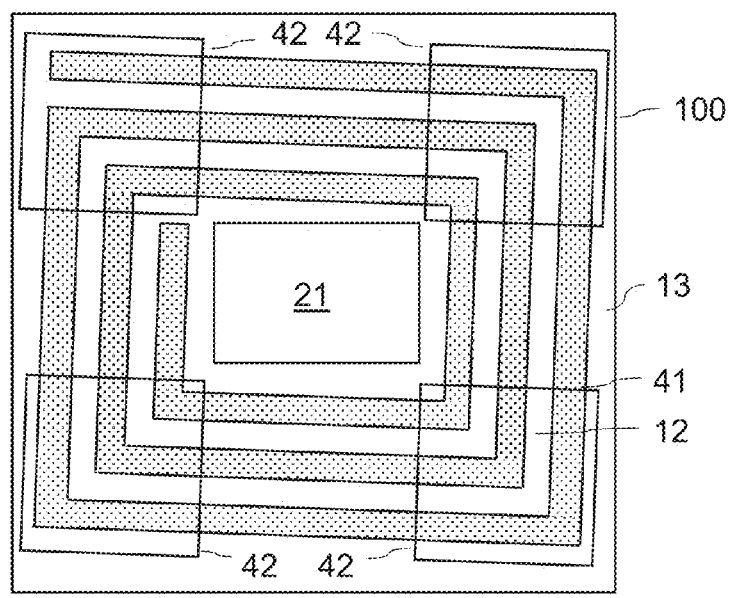
FIG. 12 illustrates a horizontal cross sectional view of a semiconductor device having an edge termination with several resistive layers according to a fourth embodiment.

When the resistive layer 42 is not implemented as a continuous layer, but is implemented with several layer segments, there could be sections in the mesa regions 12 where minority charge carriers can accumulate. FIGS. 11 and 12 illustrate horizontal cross sectional views of semiconductor devices in which the resistive layer 42 is implemented with several layer segments 42 and in which the accumulation of minority charge carriers in segments of the mesa regions 12 is prevented. In the semiconductor device of FIG. 11, the dielectric regions 41 are concentric rectangular rings, and in the embodiment of FIG. 12, the dielectric regions 41 form a spiral with several rectangular windings. In FIG. 11, vector E illustrates the direction of the electric field in one section of the edge region 120 when the device junction is reverse biased. While in the embodiments explained before the direction of the electric field is perpendicular to the elongated sections of the rectangular dielectric rings or the rectangular windings, the elongated sections of the rectangular rings or the rectangular windings according to FIGS. 11 and 12 have an angle α of between 85° and 89° relative to the direction of the electric field. This can be obtained by forming the elongated sections of the rectangular rings 41 relative to the second device region 21 such that these elongate sections are not parallel to edges of the second device region 21 but that there is angle of between 1° and 5° between the edges of the device region 21 and the elongated sections of the rectangular rings 41. The "edges" of the second device region 21 terminate the second device region 21 in a lateral direction.

Referring to FIG. 11, the electric field E has a vertical component $E_V$ that is perpendicular to the elongated sections of the dielectric regions 41, and has a parallel section $E_P$ that is parallel to the elongated sections. This parallel component $E_P$ drives minority charge carriers accumulated below the first surface 101 in the direction of the corners of the rectangular dielectric regions 41. The resistive layers 42 are located above the corners of the dielectric regions 41, collect the minority carriers and conduct the minority carriers to the second device region 21. The position of the resistive layer segments 42 above the dielectric regions 41 is schematically illustrated in FIGS. 11 and 12. These resistive layer segments 42 can be implemented as elongated segments (as illustrated in FIGS. 9 and 10) or can be implemented as planar layer segments completely covering the edge region in the corners of the dielectric regions 41 and the mesa regions 12.

Figure 13:
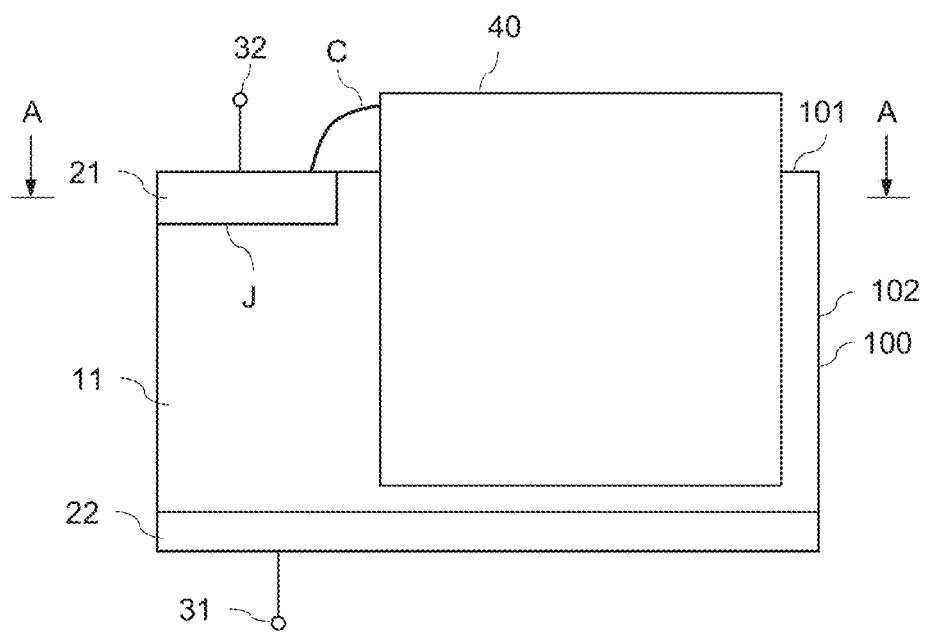
FIG. 13 illustrates a vertical cross sectional view of a semiconductor device implemented as a diode.

Referring to FIG. 13, the semiconductor device can be implemented as a vertical diode. The diode is a p-i-n diode (junction diode) when the second device region 21 is a doped region of the doping type complementary to the drift region 11, and the diode is a Schottky diode, when the second device region 21 is a Schottky region. The edge termination structure 40 is only schematically illustrated in FIG. 13.

Figure 14:
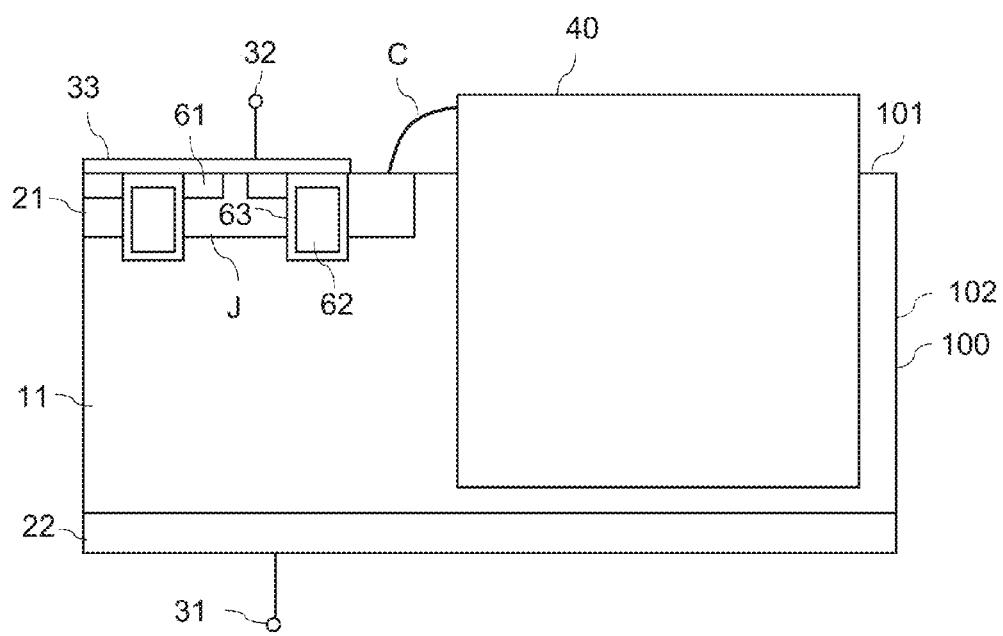
FIG. 14 illustrates a vertical cross sectional view of a semiconductor device implemented as an MOS transistor.

Referring to FIG. 14, the semiconductor device could also be implemented as a MOS transistor. In a MOS transistor the second device region 21 is a body region and is doped complementary to the drift region 11. The third device region 33 is a drain region of the MOS transistor. The first terminal 31 is a drain terminal, and the second terminal 32 is a source terminal. The MOS transistor further includes a source region 61 of the same doping type as the drift region 11 but higher doped, a gate electrode 62 arranged adjacent the body region 21 and dielectrically insulated from the body region 21 by a gate dielectric 63. The source region 61 and the body region 21 are connected to a source electrode 33 that is connected to the source terminal 32. In the embodiment illustrated in FIG. 14, the gate electrode 61 is implemented as a trench electrode. However, the gate electrode could also be implemented as a planar electrode. MOS transistors with a trench electrode structure or a planar electrode structure are commonly known, so that no further explanations are required in this regard.

The MOS transistor can be implemented as a MOSFET. In this case, the drain region 22 has the same doping type as the drift region 11. The MOS transistor could also be implemented as an IGBT. In this case, the drain region 22 has a doping type complementary to the doping type of the drift region 11. Since the leakage current is amplified by the complementarily doped region of an IGBT it is beneficial to use the complementary doping only in at least parts of the inner region 110 of the device where the MOS transistor structures are located and where the complementarily doped region is needed to improve the conduction properties of the IGBT. Under the edge termination structure 40 and optionally in an area adjoining the edge termination structure 40 the doping type may be the same as the doping type of the drift region 11.

The edge termination structure 40 is, of course, not restricted to be implemented in a diode, a MOSFET, or an IGBT. The edge termination structure 40 can be implemented in each type of semiconductor device, in particular in each type of vertical semiconductor device. Other types of semiconductor devices in which the edge termination structure 40 can be implemented are, for example, bipolar junction transistors (BJTs), or thyristors.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a semiconductor body comprising a first surface, an inner region and an edge region;
   a first doped device region of a first doping type in the inner region and the edge region;
   a second device region forming a device junction in the inner region with the first device region;
   a plurality of at least two dielectric regions extending from the first surface into the semiconductor body, with two dielectric regions that are adjacent in a lateral direction of the semiconductor body being separated by a semiconductor mesa region; and
   a resistive layer connected to the second device region and connected to at least one semiconductor mesa region.

2. The semiconductor device of claim 1, wherein the resistive layer has a specific resistance of between 1e3 Ωmm/m and 1e7 Ωmm/m.

3. The semiconductor device of claim 1, wherein the resistive layer comprises a semi-insulating material.

4. The semiconductor device of claim 3, wherein the semi-insulating material is an amorphous or polycrystalline semiconductor material.

5. The semiconductor device of claim 4, wherein the semiconductor material comprises one of SiC, GaN, GaAs, AlGaN and Si.

6. The semiconductor material of claim 4, wherein the semi-insulating material comprises doped glass, DLC or aC:H.

7. The semiconductor device of claim 1, wherein the dielectric regions are ring-shaped and surround the inner region.

8. The semiconductor device of claim 1, wherein the dielectric regions are ring segments and adjoin one another such that the dielectric regions form a spiral surrounding the device junction.

9. The semiconductor device of claim 1, further comprising:
   an edge surface; and
   a doped outer region of the first doping type between the edge surface and the dielectric regions and having a higher doping concentration than the second device region in the inner region.

10. The semiconductor device of claim 9, wherein the resistive layer is connected to the doped outer region.

11. The semiconductor device of claim 1, wherein the resistive layer is a continuous layer.

12. The semiconductor device of claim 1, wherein the resistive layer comprises several layer segments that are distant.

13. The semiconductor device of claim 12, wherein each layer segment is connected to the second device region and to at least one semiconductor mesa region.

14. The semiconductor device of claim 13, further comprising a plurality of mesa regions, wherein each layer segment is connected to each of the mesa regions.

15. The semiconductor device of claim 1, wherein the resistive layer comprises at least one elongated layer segment.

16. The semiconductor device of claim 15, wherein the at least one elongated layer segment extends perpendicular to an edge of the second device region.

17. The semiconductor device of claim 15, wherein the at least one elongated layer segment has a longitudinal direction, and wherein an angle of between 10° and 80° is between the edge of the second device region and the longitudinal direction.

18. The semiconductor device of claim 17, wherein the angle between the edge of the second device region and the longitudinal direction is between 30° and 60°.

19. The semiconductor device of claim 1, wherein the number of dielectric regions is between 3 and 20, or between 3 and 10.

20. The semiconductor device of claim 1, wherein a width of one dielectric region is between 0.05 μm and 20 μm, or between 0.05 μm and 5 μm.

21. The semiconductor device of claim 1, further comprising:
   a further doped device region distant to the second device region in a vertical direction of the semiconductor body.

22. The semiconductor device of claim 21, wherein the dielectric layers extend to or into the further doped device region.

23. The semiconductor device of claim 21, wherein the dielectric layers are distant to the further doped device region.

24. The semiconductor device of claim 1, wherein the semiconductor device is one of a MOSFET, an IGBT, a thyristor, a BJT, a junction diode, or a Schottky diode.

* * * * *